(12) United States Patent
Liang et al.

(10) Patent No.: US 6,593,602 B2
(45) Date of Patent: Jul. 15, 2003

(54) EDGE EMISSION TYPE SEMICONDUCTOR DEVICE FOR EMITTING SUPER LUMINESCENT LIGHT, ITS MANUFACTURE AND SPATIAL OPTICAL COMMUNICATION DEVICE

(75) Inventors: Ji Hao Liang, Meguro (JP); Yoshihiro Ogawa, Meguro (JP); Ken Sasakura, Meguro (JP); Tsuyoshi Maruyama, Meguro (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 09/940,713

(22) Filed: Aug. 27, 2001

(65) Prior Publication Data

US 2002/0024052 A1 Feb. 28, 2002

(30) Foreign Application Priority Data

Aug. 30, 2000 (JP) .......................................... 2000-260984

(51) Int. Cl.⁷ .......................................... H01L 31/0328
(52) U.S. Cl. ...................... 257/189; 257/437; 257/14; 257/25; 257/98; 438/48; 313/498
(58) Field of Search ............................. 257/11, 14, 21, 257/25, 98, 116, 117, 189, 437, 466; 313/498; 438/27, 48, 72, 636

(56) References Cited

U.S. PATENT DOCUMENTS

| 4,821,277 A | * | 4/1989 | Alphonse et al. ............. 372/45 |
| 4,901,123 A | * | 2/1990 | Noguchi et al. .............. 257/98 |
| 4,958,355 A | * | 9/1990 | Alphonse et al. ............. 372/45 |

* cited by examiner

Primary Examiner—Nathan J. Flynn
Assistant Examiner—Scott R Wilson
(74) Attorney, Agent, or Firm—Frishauf, Holtz, Goodman & Chick, P.C.

(57) ABSTRACT

A substrate has first and second edges disposed in parallel and a principal surface connecting the first and second edges. An active layer is formed on the principal surface. A ridge-like region is disposed on the active layer along a path interconnecting a point on the first edge and a point on the second edge. The ridge-like region is made of semiconductor material having a refraction index smaller than a refraction index of the active layer, and defines a waveguide. The path is disposed along the principal surface and includes a first region on the side of the first edge and a second region on the side of the second edge. A first angle is taken between a normal to the first edge directing toward the principal surface and the first region. A second angle smaller than the first angle is taken between a normal to the second edge directing toward the principal surface and the second region. Electrodes inject current in a region of the active layer along the path.

11 Claims, 12 Drawing Sheets d=0.3 μm d=0.5 μm

EDGE EMISSION TYPE SEMICONDUCTOR DEVICE FOR EMITTING SUPER LUMINESCENT LIGHT, ITS MANUFACTURE AND SPATIAL OPTICAL COMMUNICATION DEVICE

This application is based on Japanese Patent Application 2000-260984, filed on Aug. 30, 2000, the entire contents of which are incorporated herein by reference.

BACKGROUND OF THE INVENTION

A) Field of the Invention

The present invention relates to an edge emission type semiconductor device, its manufacture method, and a spatial optical communication device, and more particularly to an edge emission type semiconductor device for emitting super luminescent light (SL light), its manufacture method, and a spatial optical communication device using such a semiconductor device.

B) Description of the Related Art

Super luminescent diodes (SLD) have been studied for applications to semiconductor optical amplifiers and optical fiber gyro power sources. Light output from SLD has low coherence. The operation of SLD relies upon suppression of laser oscillation. However, SL light is emitted via a waveguide having a light gain so that it can be modulated at high speed. From this reason, SLD has drawn attention in terms of a high-speed spatial optical communication element. As a method of suppressing laser oscillation, a method of lowering a reflectivity at both edges of a waveguide, a method of partially forming a light absorption region in a waveguide, and other methods have been proposed.

Both edges of a waveguide are coated with antireflection material in order to lower a reflectivity at both the edges. However, it is difficult to manufacture a high output SLD by lowering the reflectivity to $1 \times 10^{-5}$ or smaller. This method is therefore not practical. SLD partially formed with a light absorption region absorbs about a half of the energy of light radiated in a luminescent layer. This poses a problem of a lower luminescent efficiency and heat generation by light absorption. In addition, the element becomes long.

SUMMARY OF THE INVENTION

It is an object of the present invention to provide an edge emission type semiconductor device capable of obtaining a relatively large light output without lowering the luminescent efficiency, and its manufacture method.

It is another object of the present invention to provide a spatial optical communication device using such an edge emission type semiconductor device.

According to one aspect of the present invention, there is provided an edge emission type semiconductor device, comprising: a substrate having first and second edges disposed in parallel with each other and a principal surface connecting the first edge with the second edge; an active layer formed on the principal surface and made of semiconductor material radiating light upon injection of carriers; a ridge-like region disposed on the active layer along a path interconnecting a point on the first edge and a point on the second edge, the ridge-like region being made of semiconductor material having a refraction index smaller than a refraction index of the active layer, the ridge-like region defining a waveguide, the path being disposed along the principal surface and including a first region on the side of the first edge and a second region on the side of the second edge, at an intersecting point of the first region and the first edge, a first angle being taken between a normal to the first edge directing toward the principal surface and the first region, and at an intersecting point of the second region and the second edge, a second angle smaller than the first angle being taken between a normal to the second edge directing toward the principal surface and the second region; and electrodes for injecting current in a region of the active layer along the path.

Since the first region is slanted from the normal to the first edge, the components of light are small, which light propagates toward the first edge along the path along the ridge-like region and is reflected at the first edge and returned to the path. It is therefore possible to suppress laser oscillation. SL light is radiated from the first edge. Since the second angle is smaller than the first angle, more components of light reflected at the second edge return to the path. It is therefore possible to suppress unnecessary radiation from the second edge and increase the intensity of SL light to be radiated from the first edge.

According to another aspect of the present invention, there is provided a spatial optical communication device comprising: the edge emission type semiconductor device; and a light receiving device for receiving light radiated from the first edge of the edge emission type semiconductor device.

Spatial optical communication is performed by using SL light. As compared to using luminescence by LED, transmission at higher speed is possible.

According to another aspect of the present invention, there is provided a method of manufacturing an edge emission type semiconductor device, comprising: when setting two cleavage directions to X- and Y-directions of a surface of a semiconductor substrate and considering a plurality of first virtual straight lines disposed in parallel to the Y-direction and spaced by some distance from each other along the X-direction and a plurality of second virtual straight lines disposed in parallel to the X-direction and spaced by some distance from each other along the Y-direction, a step of forming a waveguide structure for propagating light along a plurality of paths parallel to the surface of the semiconductor substrate, each of the plurality of paths being disposed between two adjacent first virtual straight lines, the path having a pattern of first and second regions alternately disposed along the Y-direction, the first region being slanted relative to the Y-direction and the second region being parallel to the Y-direction, and each of the first and second regions crossing the second virtual straight line; a step of forming grooves in the surface layer of the semiconductor substrate along the first virtual straight lines; a step of cleaving the semiconductor substrate along the second virtual straight lines; and a step of further cleaving the cleaved semiconductor substrate along the grooves.

Since the linear first and second regions cross the second virtual straight lines, a high position precision is not necessary when cleavage is performed along the second virtual straight lines.

DETAILED DESCRIPTION OF THE PREFERRED EMBODIMENTS

Figure 1:
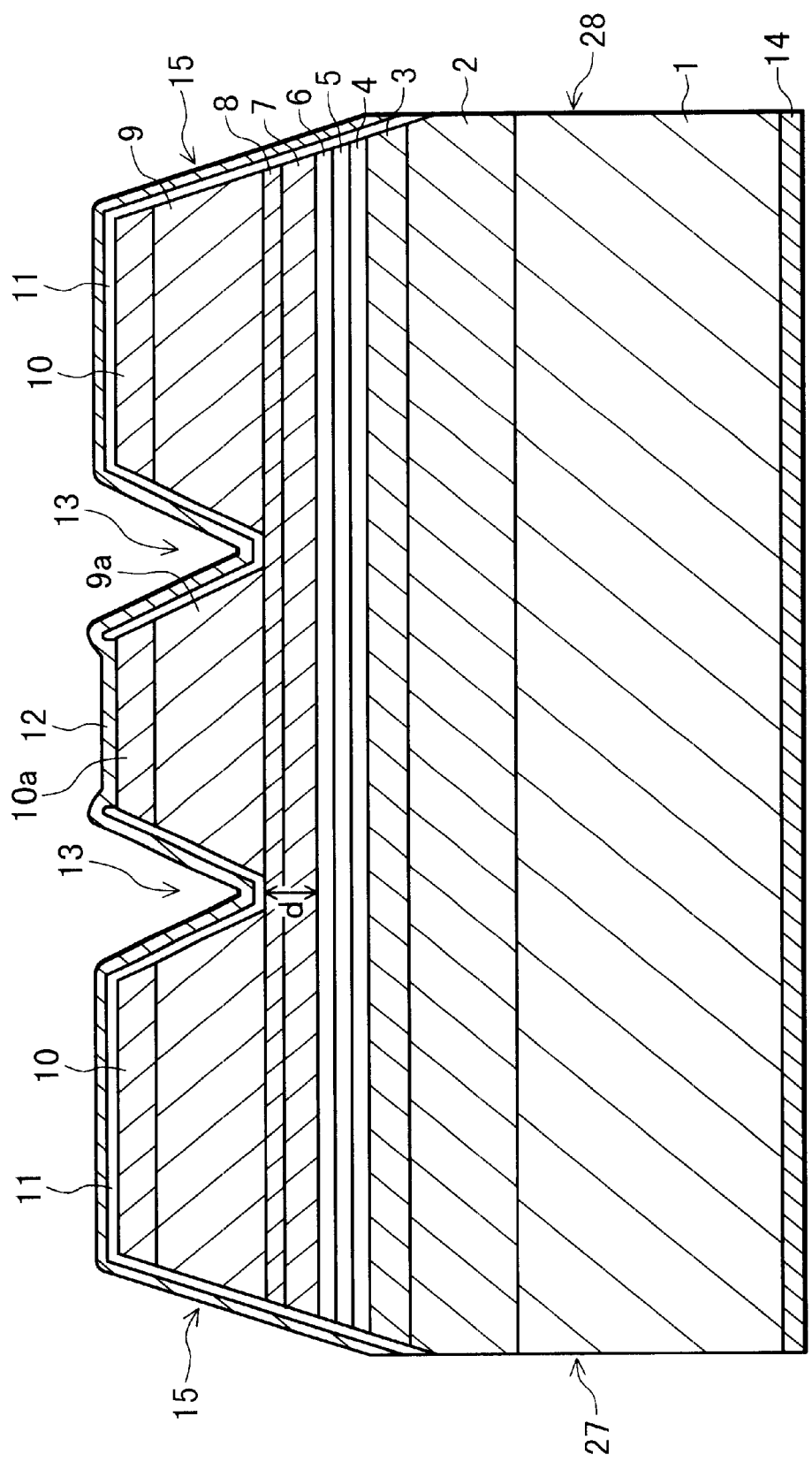
FIG. 1 is a cross sectional view of an SLD according to an embodiment of the invention.

FIG. 1 is a cross sectional view of an SLD according to an embodiment of the invention. On the principal surface of a substrate 1 made of n-type GaAs, a buffer layer 2 made of n-type GaAs is formed. The principal surface of the substrate 1 has Miller indices of (100). Impurities doped in the substrate 1 and buffer layer 2 are silicon (Si) at a concentration of $1 \times 10^{18}$ cm$^{-3}$. On the buffer layer 2, an n-type clad layer 3 is formed which is made of n-type InGaP having a band gap of 1.90 eV and a thickness of 1 μm. Impurities of an n-type doped in the n-type clad layer 3 are Si at a concentration of $7.5 \times 10^{17}$ cm$^{-3}$.

On the n-type clad layer 3, an n-side separation confinement type hetero layer (SCH layer) 4, a multiple quantum well layer (active layer) 5 and a p-side SCH layer 6 are sequentially stacked upon in this order. Each of the n-side SCH layer 4 and p-side SCH layer 6 is made of InGaAsP having a band gap of 1.45 to 1.85 eV, and has a thickness of 80 nm. The multiple quantum well layer 5 is made of three well layers each having a thickness of 5 nm and made of InGaAs and two barrier layers each having a thickness of 10 nm and made of InGaAsP. The multiple quantum well layer 5 has a lamination structure of the three well layers and two barrier layers alternately stacked upon. The well layer has a band gap corresponding to a wavelength of 0.94 μm and the barrier layer has a band gap corresponding to a wavelength of 0.76 μm.

On the p-side SCH layer 6, a p-type clad layer 7 made of p-type InGaP and having a thickness of 0.3 μm and an etching stopper layer 8 made of p-type GaAs and having a thickness of 3 nm are sequentially stacked upon in this order. On the etching stopper layer 8, a p-type InGaP layer of 0.7 μm in thickness and a p-type GaAs layer 10 of 0.2 μm in thickness are sequentially stacked. These two layers have two grooves 13 which are disposed in parallel and reach the upper surface of the etching stopper layer 8. A lamination of a ridge-like clad layer 9a of p-type InGaP and a contact layer 10a of p-type GaAs is defined between the two grooves 13. A ridge-like region constituted of the ridge-like clad 9a and contact layer 10a defines a waveguide along the multi quantum well layer 5.

Impurities doped in the p-type clad layer 7 and p-type InGaP layer 9 are zinc (Zn) at a concentration of $7.5 \times 10^{17}$ cm$^{-3}$. Impurities doped in the contact layer 10a are Zn at a concentration of $1 \times 10^{19}$ to $2 \times 10^{19}$ cm$^{-3}$.

Figure 2:
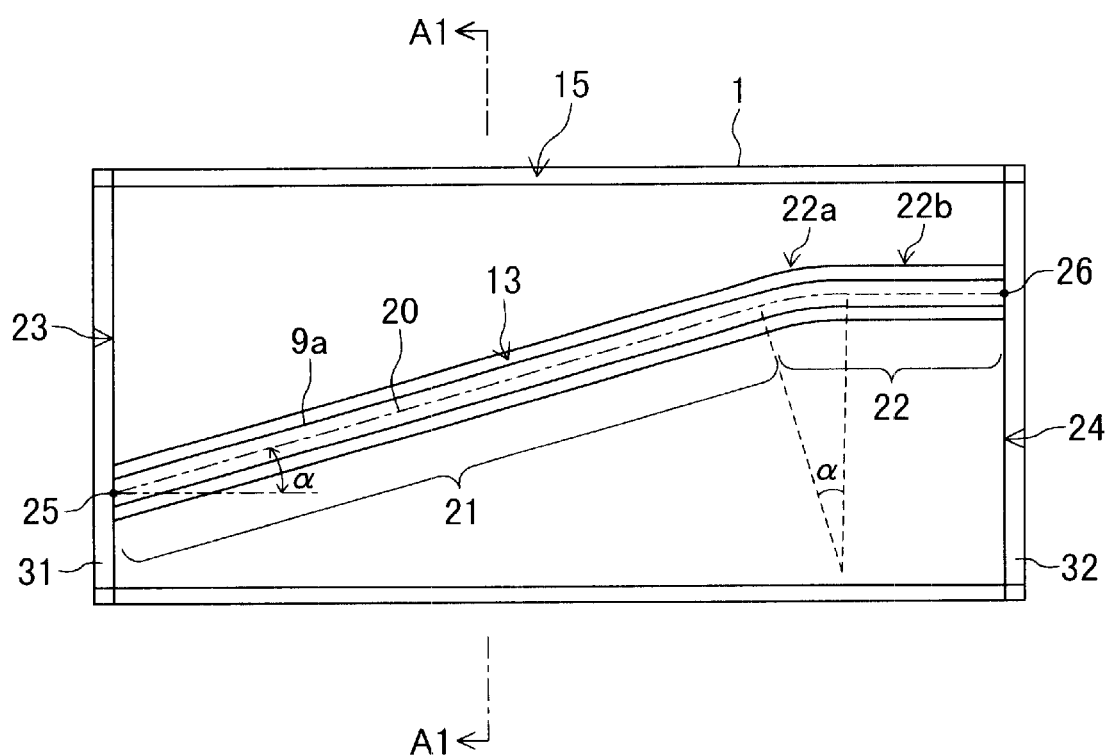
FIG. 2 is a plan view of SLD of the embodiment.

FIG. 2 shows the plan view of SLD of the embodiment. The cross sectional view of FIG. 1 corresponds to the cross sectional view taken along one-dot chain line A1—A1 of FIG. 2. The principal surface of the substrate 1 is of a rectangle shape having a length of 750 μm and a width of 200 μm. An edge at one of two short sides of the principal surface is an output edge 23, and an edge at the other short side is a reflection edge 24.

The ridge-like clad layer 9a is disposed along the waveguide 20 interconnecting a point 25 on the output edge 23 and a point 26 on the reflection edge 24. The waveguide 20 is constituted of a first region 21 on the output edge 23 side and a second region 22 on the reflection edge 24 side. The first region 21 is straight and slanted relative to a normal to the output edge 23 directing from the point 25 toward the principal surface. This slanted angle is called a tilt angle α.

The second region 22 is constituted of a straight region 22b continuous with the reflection edge 24 and an arc region 22a smoothly connecting the straight region 22b to the first region 21. The straight region 22b contacts the reflection edge 24 at a right angle. The central angle of the arc region 22a is equal to the tilt angle α.

An antireflection film 31 is formed on the output edge 23, and a reflection film 32 is formed on the reflection edge 24.

Reverting to FIG. 1, regions are chamfered which correspond to edges between the principal surface of the substrate 1 and side surfaces 27 and 28 of the four side surfaces of the substrate 1 other than the output edge 23 and reflection edge 24. Opposite ends of the multi quantum well layer 5 are positioned on the slanted surfaces of these chamfers 15. The chamfer 15, a side wall of the groove 13, and the upper surface of the p-type GaAs layer 10 therebetween are covered with a protective film 11 made of insulating material such as silicon oxide.

A p-side electrode 12 covers the upper surfaces of the protective film 11 and contact layer 10a. The p-side electrode 12 is a TiAu alloy film having a thickness of 300 nm. An n-side electrode 14 is formed on the bottom of the substrate 1. The n-side electrode 14 is an AuGe alloy film having a thickness of 200 nm.

Next, a method of manufacturing SLD of the embodiment shown in FIGS. 1 and 2 will be described. First, on the principal surface of the substrate 1, layers from the buffer layer 2 to p-type GaAs layer 10 are sequentially stacked upon by using metal organic chemical vapor deposition (MOCVD). Source materials used are trimethylgalium (TMGa), trimethylindium (TMIn), arsine (AsH$_3$), and phosphine (PH$_3$)$^-$. As source materials for impurities Zn and Si, dimethylzinc (DMZn) and silane (SiH$_4$) are used. A growth temperature is set to 730° C. and a pressure is set to $1 \times 10^4$ Pa. A V/III ratio when the GaAs layer is formed is set to 100, and a V/III ratio when the InGaP layer is formed is set to 76.

Next, grooves 13 are formed which extend from the upper surface of the p-type GaAs layer 10 and reach the upper surface of the etching stopper layer 8. The p-type GaAs layer 10 is etched by using mixed etchant of phosphoric acid (H$_3$PO$_4$), hydrogen peroxide (H$_2$O$_2$) and water (H$_2$O). The p-type InGaP layer 9 is etched by using mixed etchant of hydrochloric acid (HCl) and phosphoric acid. Since the etching stopper layer 8 is disposed under the p-type InGaP layer 9, the etching depth can be controlled with good reproductivity.

Next, V grooves are formed in areas corresponding to the chamfers 15. The slanted surface of the chamfer 15 corresponds to a side wall of the V groove.

A silicon oxide film is deposited over the whole substrate surface by electron beam vapor deposition. This silicon oxide film is patterned to expose the upper surface of the contact layer 10a. A p-side electrode 12 is formed on the whole substrate surface by sputtering. The bottom of the substrate 1 is polished until the thickness of the substrate becomes about 100 µm. After polishing, an n-side electrode 14 is formed on the bottom surface of the substrate 1 by sputtering.

Next, a first cleavage is performed along the output edge 23 and reflection edge 24. An antireflection film 31 is formed on the output edge 23 and a reflection film 32 is formed on the reflection edge 24, respectively by sputtering. The antireflection film 31 and a reflection film 32 each have a lamination structure of a titanium oxide film and a silicon oxide film.

Next, a second cleavage is performed along the V groove. With this second cleavage, the side surfaces 27 and 28 shown in FIG. 1 appear and the wafer is divided into chips.

In this SLD of the embodiment, the ridge-like regions 9a and 10a define the slanted waveguide. Since the waveguide contacts the output edge obliquely, light fluxes reflected at the output edge 23 hardly return to the waveguide. Laser oscillation can therefore be suppressed. On the reflection edge 24 side, the waveguide contacts the reflection edge 24 at a right angle. A relatively large number of reflected waves return to the waveguide. It is therefore possible to reduce unnecessary radiation from the reflection edge 24 and increase an output of SL light from the output edge 23.

The insides of the grooves 13 formed on both sides of the ridge-like regions 9a and 10a are filled with the air. Since there is a large difference between the refraction indices of the ridge-like regions 9a and 10a and the air, the waveguide effects can be enhanced. If the waveguide bent as shown in FIG. 2 is used, it is preferable to use the embodiment structure in order to enhance the waveguide effects.

In the SLD of the embodiment, as shown in FIG. 1, the opposite ends of the multi quantum well layer 5 on the sides of the side surfaces 27 and 28 are positioned in the slanted surfaces of the chamfers 15. This slanted surface corresponds to the side wall of the V groove formed by etching. Generally, if a crack enters a pn junction, leak current caused by the crack flows. In the embodiment, the V groove is formed deeper than the pn junction, and the cleavage is performed by utilizing the V groove. Since a crack is not formed in the pn junction by scribing, an increase of leak current can be prevented. It is also possible to prevent any stain on a chip to be caused by scribing.

When the p-side electrode 12 is adhered (bonded) to a heat dissipation block or the like, bonding material such as AuSn, AuGe, SnPb and In may invade the edges of an SLD chip. In this embodiment, since the opposite ends of the multi quantum well layer 5 on the sides of the side surfaces 27 and 28 are covered with the protective film 11 so that an increase of leak current to be caused by invasion of the bonding material can be prevented.

In this embodiment, the V groove is formed for the second cleavage. Instead of the V groove, a U-character shaped groove may be formed to scribe the bottom of the U-character shaped groove. In this case, the U-character shaped groove is formed deeper than the lower surface of the multi quantum well layer 5 to prevent generation of a crack from being formed in the pn junction by scribing.

Figure 3:
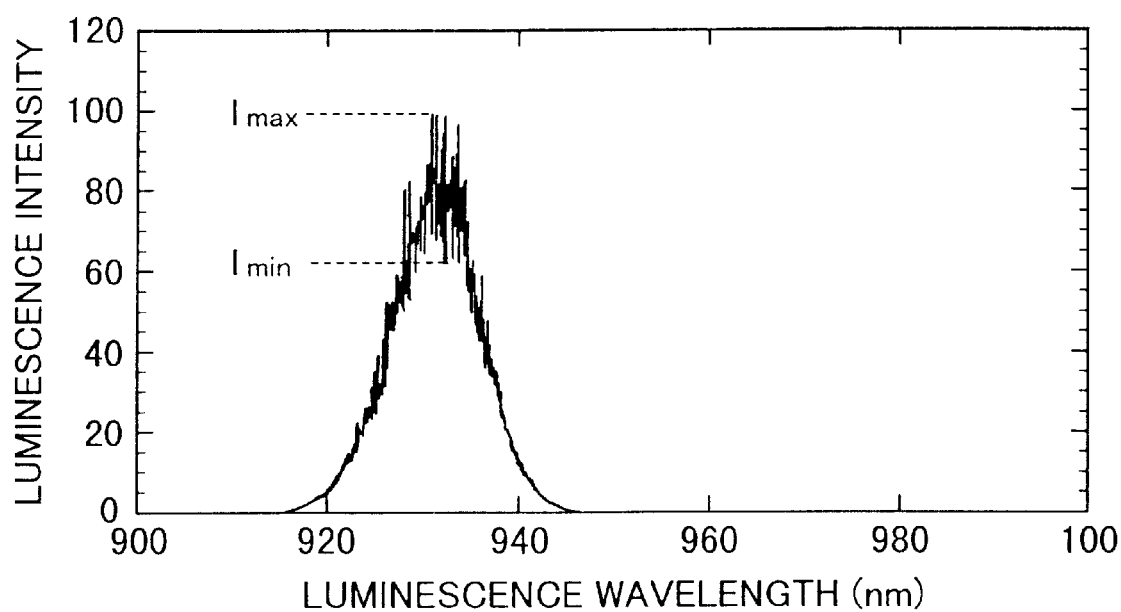
FIG. 3 is a graph showing an example of spectra of SL light.

FIG. 3 shows an example of luminescence spectra of SLD manufactured by the embodiment method. The abscissa represents a luminescence wavelength in the unit of "nm" and the ordinate represents luminescence intensity in the relative scale with a maximum value of 100. The luminescence spectra of SLD have the spectral characteristics broader than the luminescence spectra with laser oscillation.

A spectral modulation depth (SMD) is defined by:

$$SMD = (I_{max} - I_{min})/(I_{max} + I_{min})$$

where $I_{max}$ is the maximum value of luminescence intensity and $I_{min}$ is the minimum value of luminescence intensity in the wavelength range very near at the luminescence wavelength which gives the maximum value of the luminescence intensity. If laser oscillation is used, SMD is approximately 100%. With the SLD of the embodiment, SMD was 20% or smaller.

Figure 4:
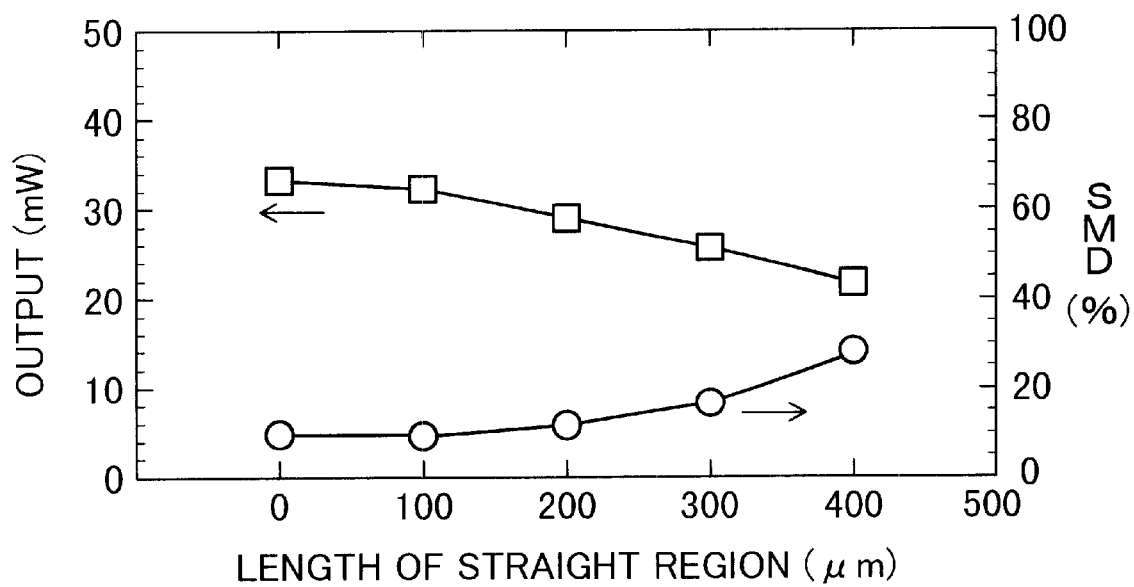
FIG. 4 is a graph showing changes in an output and SMD of SLD of the embodiment when the length of a straight region of a second region of a waveguide of SLD is changed.

FIG. 4 shows changes in an output and SMD when the length of the straight region 22b of the second region 22 shown in FIG. 2 is changed. Injected current is 100 mA. The abscissa represents a length of the straight region 22b in the unit of "µm", the left ordinate represents an output of SL light in the unit of "mW", and the right ordinate represents SMD in the unit of "%". The length of the longer side of an SLD chip (a distance between the output edge 23 and reflection edge 24) is 750 µm, the width of the ridge-like region 9a, 10a is 4 µm, the reflectivity at the output edge 23 is 0.3%, the reflectivity at the reflection edge 24 is 31%, and the tilt angle is 7°. The width of the ridge-like region 9a, 10a means the width of the upper surface of the contact layer 10a. That the length of the straight region 22b is 0 µm means that the arc region 22a shown in FIG. 2 is directly connected to the reflection edge 24.

As the straight region 22b is elongated, SMD lowers and the operation state comes near laser oscillation and the output lowers. This may be ascribed to the following reasons. A portion of light propagating along the straight region 22b toward the output edge 23 does not enter the first region 21 but propagates straight. The light propagating straight is reflected at the output edge 23 and returns back to the straight region 22b. As the straight region 22b is elongated and comes near the output edge 23, the components of light returning back to the straight region 22b become large. From this reason, the operation state comes near laser oscillation and SMD becomes large.

If the straight region 22b is short, attenuation of the light components propagating straight becomes large so that the light components reflected at the output edge 23 and returned back to the straight region 22b are very small. It is conceivable from this that laser oscillation is difficult to occur and SMD becomes small. In order to suppress laser oscillation and lower SMD, it is preferable that a ratio of the length of the longer side of the principal surface (a distance between the output edge 23 and reflection edge 24) to the length of the straight region 22b is set to ½ or smaller.

Figure 5A:
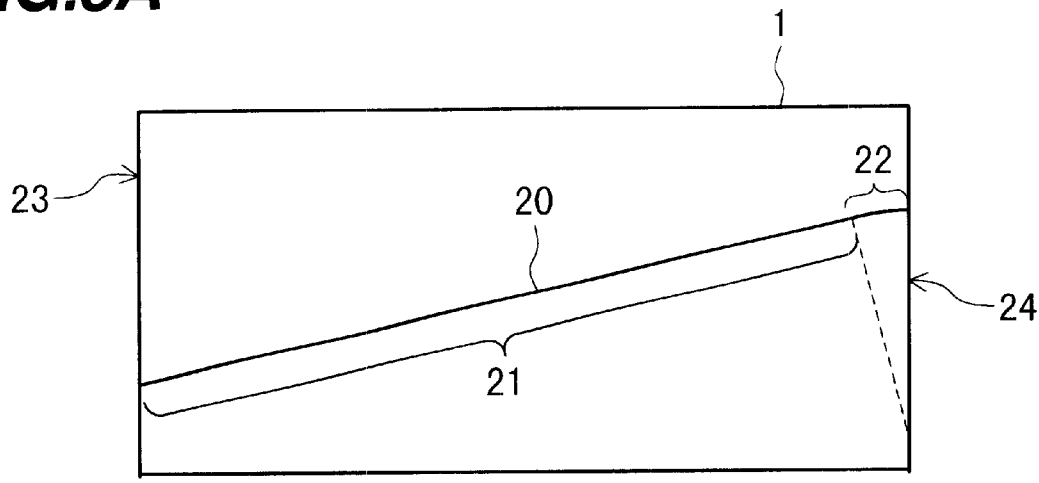
FIGS. 5A and 5B are plan views of SLD's according to modifications of the embodiment of the invention.

FIG. 5A is a schematic plan view of SLD whose straight region 22b has a length of 0. The second region 22 is constituted of only the arc region. In this case, the central point of the arc region 22 is positioned on the reflection edge 24, and the arc region 22 contacts the reflection edge 24 at a right angle.

Figure 5B:
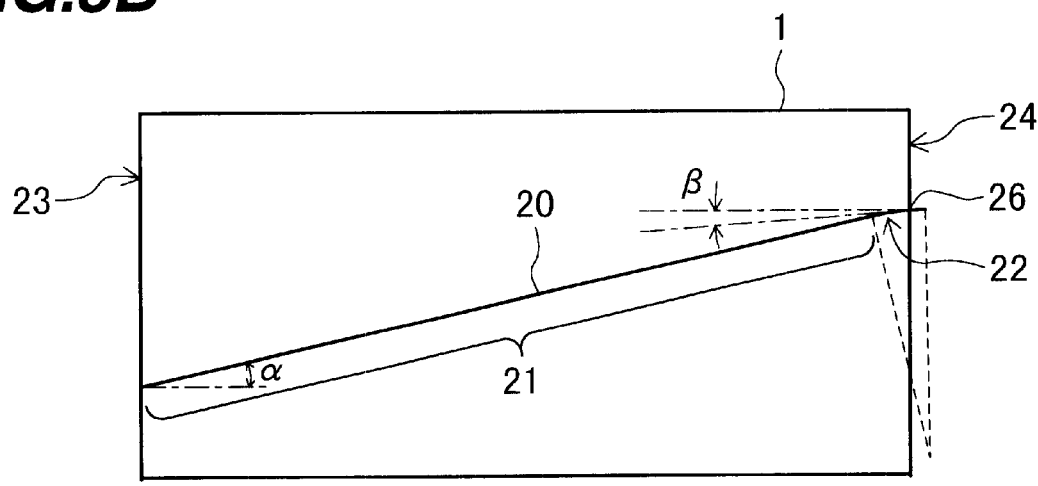

FIG. 5B shows the case that the central point of the arc region is positioned outside of the reflection edge 24. In this case, at a point 26 where the second region 22 contacts the reflection edge 24, an angle β between the second region 22 and the normal to the reflection edge 24 directing toward the principal surface, is smaller than the tilt angle α. As the angle β is set smaller than the tilt angle α, as compared to the case that the waveguide 20 is constituted of only the first region 21, the light components reflected at the reflection edge 24 and returned back to the waveguide 20 become large. The intensity of SL light output from the output edge 23 can be increased.

In FIGS. 5A and 5B, the second region 22 is constituted of the arc region. The arc region may be a region having other curved shapes. In order to reduce a transmission loss, it is preferable to use a curved shape without an inflection point as the second region 22.

Figure 6:
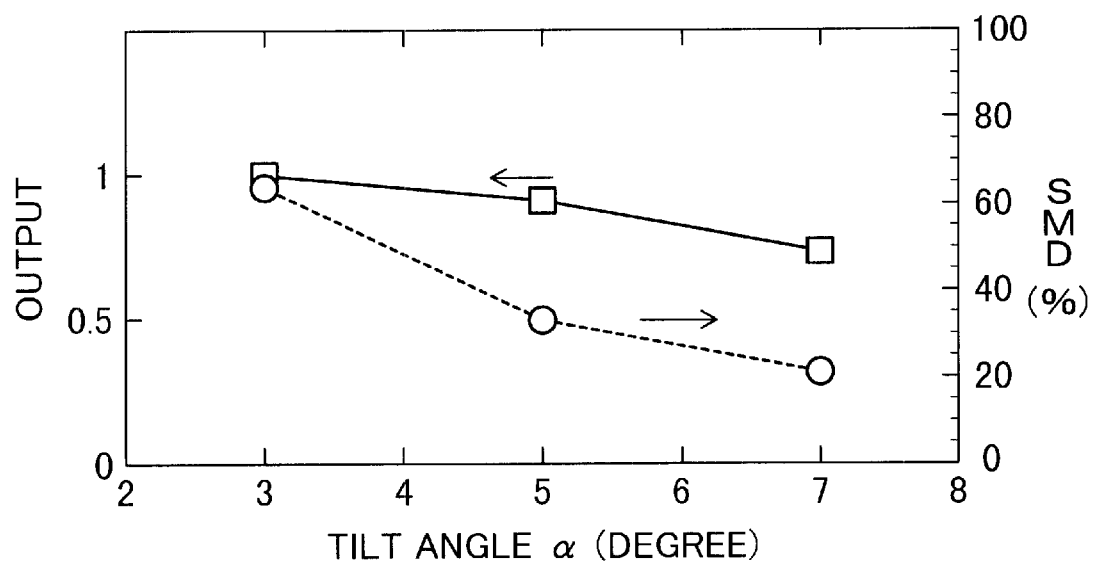
FIG. 6 is a graph showing changes in an output and SMD of SLD of the embodiment when the tilt angle of a waveguide of SLD relative to a normal to the output edge is changed.

FIG. 6 is a graph showing the relation between the tilt angle α shown in FIG. 2, an SL light output and SMD. The abscissa represents a tilt angle α in the unit of "degree", the left ordinate represents a relative output from the output edge in an arbitrary scale, and the right ordinate represents SMD in the unit of "%". The length of the longer side of the SLD chip is 750 μm, and the length of the straight region 22b of the waveguide 20 is 200 μm. The width of the ridge-like region 9a, 10a is 4 μm. Each of SLD's used for measuring the data shown in FIG. 6 does not have the antireflection film 31 and reflection film 32 on the output edge 23 and reflection edge 24 shown in FIG. 2. If the antireflection film 31 and reflection film 32 are formed, it is expected that although the absolute values of the output and SMD change, the manner how the output and SMD changes with the tilt angle α does not change.

As the tilt angle α becomes large, SMD lowers. This may be ascribed to that light components reflected at the output edge 23 and returned to the waveguide are small. As the tilt angle α becomes large, the output lowers. This may be ascribed to that light components reflected at the output edge 23 and returned to the inside of the SLD chip become large and light components output from the output edge 23 to the external become small. It is practically preferable to set the tilt angle α to 2° to 10°, and more preferably to 5° to 7°.

Figure 7:
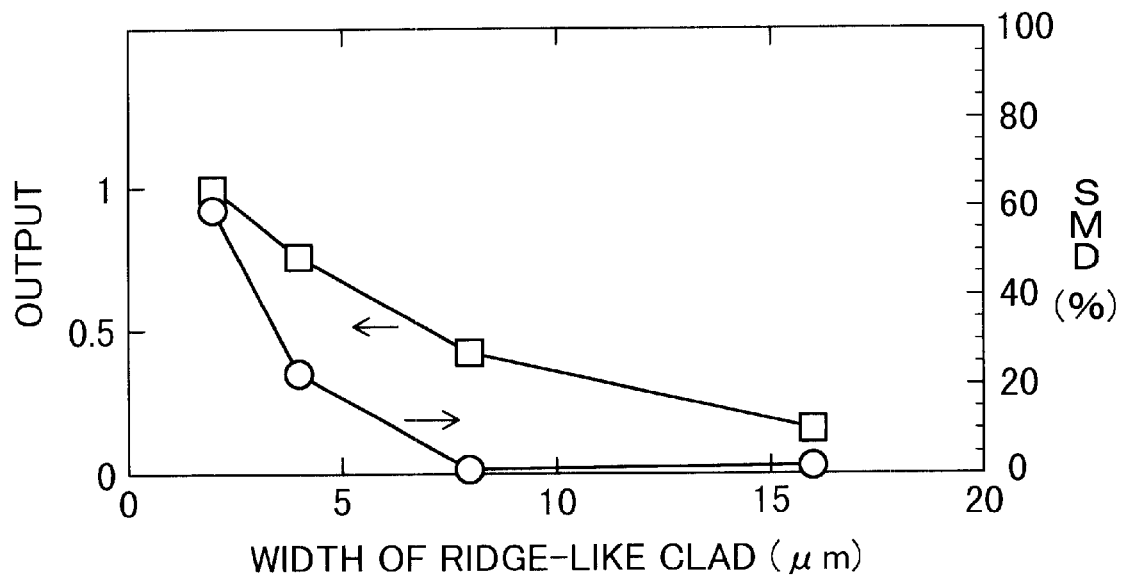
FIG. 7 is a graph showing changes in an output and SMD of SLD of the embodiment when the width of a ridge-like region which defines the waveguide of SLD is changed.

FIG. 7 is a graph showing the relation between the width of the ridge-like region 9a, 10a shown in FIG. 1, an SL light output and SMD. The abscissa represents the width of the ridge-like region 9a, 10a in the unit of "μm". The right and left ordinates are similar to those shown in FIG. 6. The length of the longer side of each SLD chip is 750 μm, the length of the straight region 22b of the waveguide 20 is 200 μm, the reflectivities of the output edge 23 and reflection edge 24 are both 31%, and the tilt angle α is 7°.

As the width of the ridge-like region is broadened, both the SL light output and SMD lower. In order to obtain high output SL light, it is preferable to set the width of the ridge-like region to 10 μm or narrower.

Figure 8:
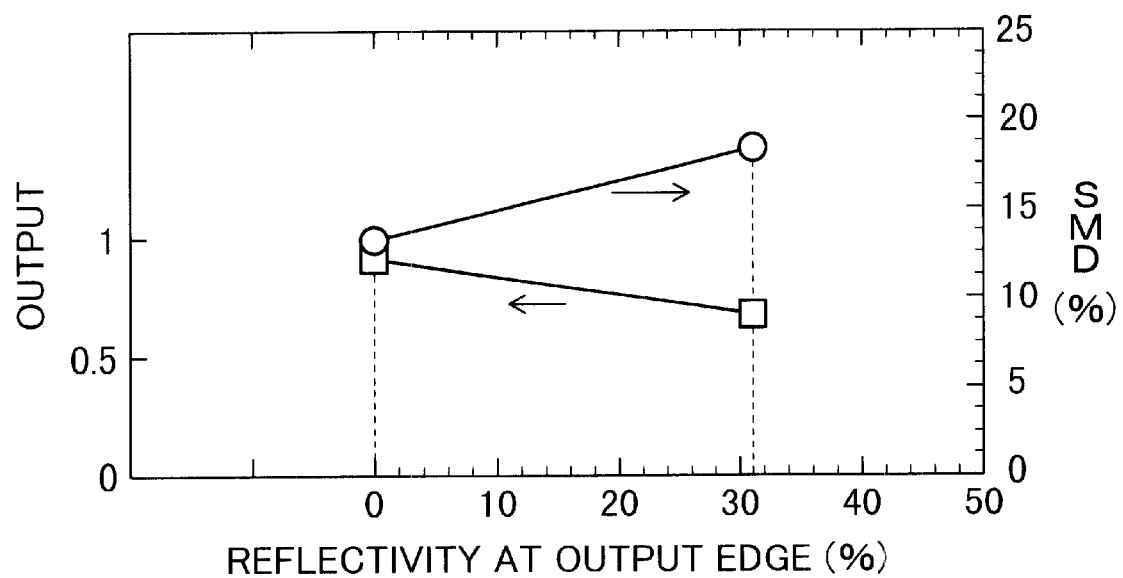
FIG. 8 is a graph showing changes in an output and SMD of SLD of the embodiment when the reflectivity at the output edge of SLD is changed.

FIG. 8 is a graph showing the relation between the reflectivity of the output edge 23, an SL light output and SMD. The abscissa represents the reflectivity of the output edge 23 in the unit of "%". The right and left ordinates are similar to those shown in FIG. 6. The length of the longer side of each SLD chip is 750 μm, the length of the straight region 22b of the waveguide 20 is 200 μm, the width of the ridge-like region is 4 μm, and the tilt angle α is 7°. The reflection film 32 is not formed on the reflection edge 24 and the cleaved surface is exposed.

An SLD with almost 0% of the reflectivity of the output edge 23 has the antireflection film 31 formed on the output edge 23. An SLD with 31% of the reflectivity of the output edge 23 does not have the antireflection film on the output edge 23 and its cleaved surface is exposed. It can be seen that as the reflectivity of the output edge 23 increases, the output lowers and SMD becomes large. This may be ascribed to that of the light reached the output edge 23, the light components reflected at the output edge 23 and returned to the waveguide increase so that laser oscillation becomes easy. As shown in FIG. 8, by forming the antireflection film 31 on the output edge 23, it becomes possible to increase the output and lower SMD.

Figure 9:
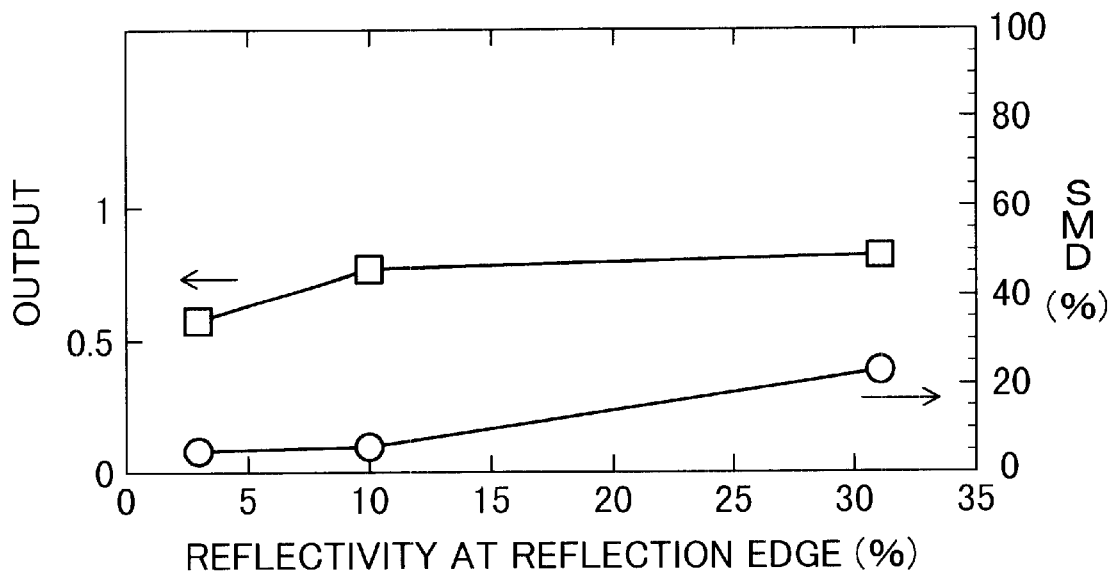
FIG. 9 is a graph showing changes in an output and SMD of SLD of the embodiment when the reflectivity at the reflection edge of SLD is changed.

FIG. 9 is a graph showing the relation between the reflectivity of the reflection edge 24, an SL light output and SMD. The abscissa represents the reflectivity of the reflection edge 24 in the unit of "%". The right and left ordinates are similar to those shown in FIG. 6. The length of the longer side of each SLD chip is 750 μm, the length of the straight region 22b of the waveguide 20 is 200 μm, the width of the ridge-like region 9a, 10a is 4 μm, and the tilt angle α is 7°. The reflectivity of the output edge 23 is 0.3%.

As the reflectivity of the reflection edge 24 increases, SMD becomes large. This may be ascribed to that light reflected at the reflection edge 24 returns to the waveguide and laser oscillation becomes easy. As the reflectivity of the reflection edge 24 lowers to about 3%, although the output lowers, the output when the reflectivity of the reflection edge 24 takes 10% has a level similar to that at the reflectivity of 31%. In order to prevent the output from being lowered and maintain SMD small, it is preferable to set the reflectivity of the reflection edge 24 to about 10%.

Next, the description will be given for the light output characteristic when the thickness d of the p-type clad layer on both sides of the ridge-like region 9a, 10a shown in FIG. 1 is changed. In the embodiment shown in FIG. 1, the p-type clad layer 7 is 0.3 μm thick and the etching stopper layer 8 is 3 nm thick. The thickness d is therefore about 0.3 μm. An evaluation sample was formed whose thickness of the p-type clad layer 7 was 0.5 μm, i.e., d was 0.5 μm.

Figure 10A:
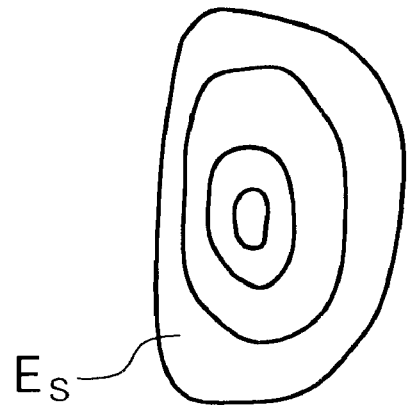
FIGS. 10A and 10B are sketches of far field images when the thickness d of the clad layers on both sides of a ridge-like region are changed.
Figure 10B:
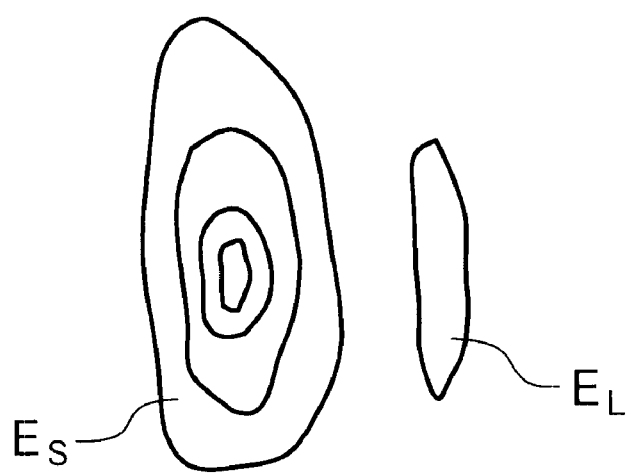

FIGS. 10A and 10B show far field images of samples having the thickness d of 0.3 μm and 0.5 μm. In both the samples such as shown in FIG. 2, the chip length is 750 μm, the straight region 22b is 200 μm long, the reflectivity of the output edge 23 is 0.3%, the reflectivity of the reflection edge 24 is 31%, and the tilt angle α is 7°. The width of the ridge-like region 9a, 10a is 4 μm. An injection current is 160 mA.

With the sample having the thickness d of 0.3 μm, as shown in FIG. 10A, only an image $E_S$ by $S_L$ light was observed. With the sample having the thickness d of 0.5 μm, as shown in FIG. 10B, not only an image $E_S$ by SL light was observed, but also an image $E_L$ by laser oscillation was observed near at the image $E_S$. The sample having the thickness d of 0.3 μm has a large difference between the refraction index of the air filled in the groove 13 and the refraction index of the ridge-like region 9a, 10a. Therefore, the ridge-like region 9a, 10a provides sufficient waveguide effects. The sample having the thickness d of 0.5 μm has a relatively thick clad layer on both sides of the ridge-like region 9a, 10a so that the waveguide effects are weakened. Therefore, as the injection current increases, laser oscillation becomes easy. It is conceivable that the image $E_L$ was observed by this laser oscillation. In order to obtain large output SL light without laser oscillation even under an increased injection current, it is preferable to set the thickness d to 0.3 μm or thinner.

Next, with reference to FIG. 11, the layout of chips on the principal surface of a GaAs wafer before it is divided into chips will be described.

Figure 11:
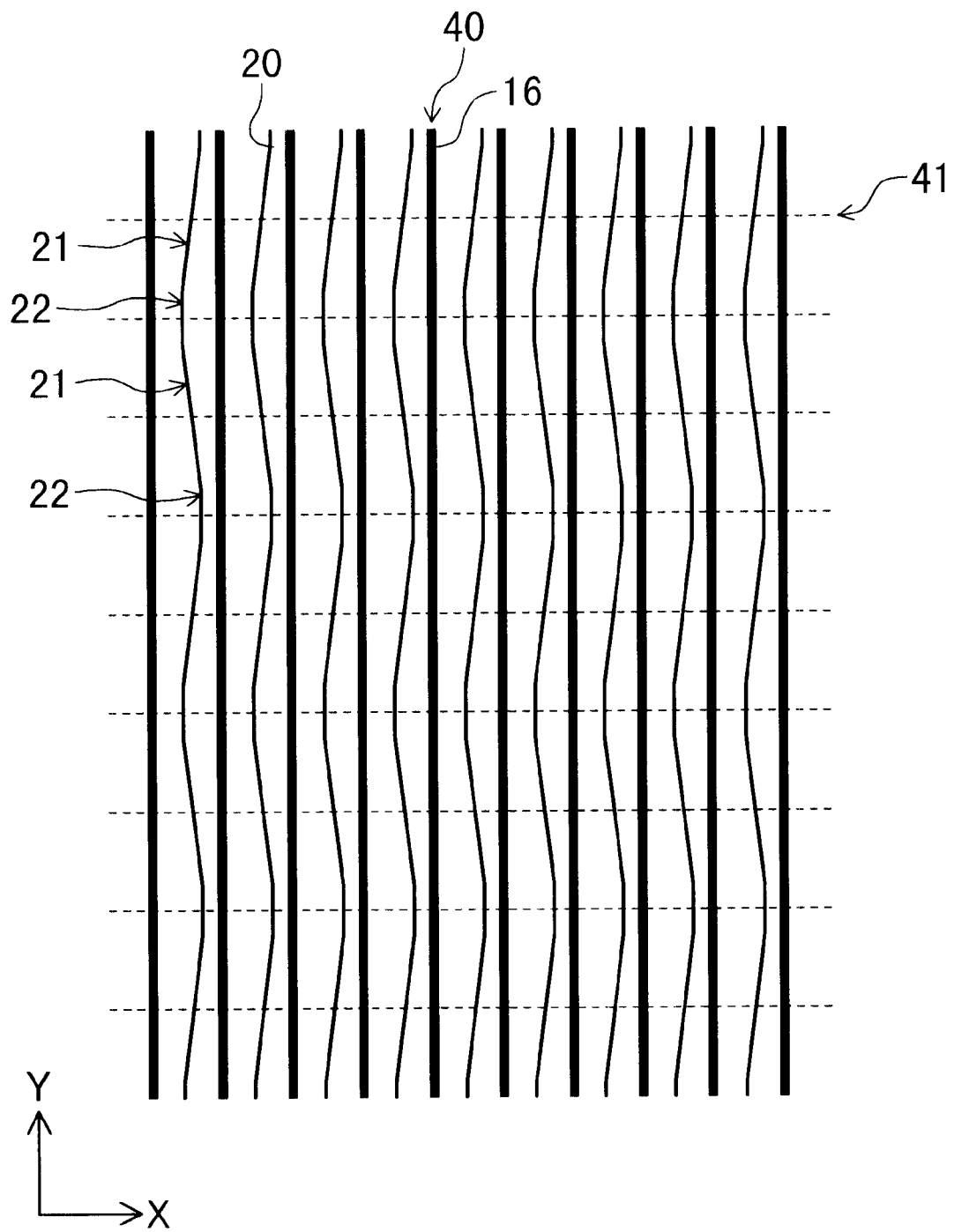
FIG. 11 is a plan view of a wafer before it is divided into SLD chips of the embodiment.

FIG. 11 is a partial plan view of a wafer before it is divided into chips. Consider an X-Y rectangular coordinate system having X- and Y-directions as two cleavage directions. A plurality of first virtual straight lines 40 and a plurality of second virtual straight lines 41 are introduced.

The first virtual straight lines 40 are in parallel to the Y-direction and disposed spaced apart by some distance from each other along the X-direction. The second virtual straight lines 41 are in parallel to the X-direction and disposed spaced apart by some distance from each other along the Y-direction.

Each waveguide 20 is disposed between adjacent two first virtual straight lines 40. The first region 21 of the waveguide 20 is slanted from the Y-direction, and the straight region of the second region 22 is disposed in parallel to the Y-direction. The first regions 21 of two adjacent chips in the Y-direction are disposed along one straight line and continuous with each other. The straight regions of the second regions 22 of two adjacent chips in the Y-direction are also disposed along one straight line in parallel to the Y-direction and continuous with each other. Therefore, a portion in parallel to the Y-direction and a portion slanted from the Y-direction appear alternately. Each of the portion in parallel to the Y-direction and the portion slanted from the Y-direction crosses the second virtual straight line. The V groove 16 is formed along the first virtual straight line 40. In this state, the protective film 11, p-side electrode 12 and n-side electrode 14 shown in FIG. 1 are formed.

Next, the processes of separating the wafer into chips will be described. First, a first cleavage is performed along the second virtual straight line 41. The cleaved surfaces correspond to the output edge 23 and reflection edge 24 shown in FIG. 2. The antireflection film 31 and reflection film 32 are formed on the cleaved surfaces. Next, a second cleavage is performed along the V groove 16. This second cleavage forms separated chips.

With this layout of chips shown in FIG. 11, the position along which the first cleavage is performed is in the central area of the straight region of the waveguide 20. Therefore, a high precision of the position of the first cleavage is not necessary. It is therefore unnecessary to provide a cleavage margin to be considered for a shift of the cleavage position. The number of chips capable of being cut from one wafer can therefore be increased.

Figure 12:
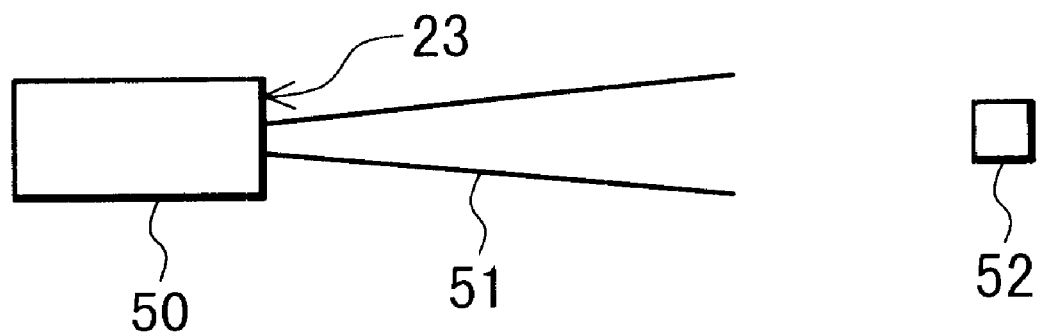
FIG. 12 is a schematic diagram of a spatial optical communication device using the light radiating device of the embodiment.

As shown in FIG. 12, spatial optical communication is possible by placing a light reception element 52 at a position capable of receiving a light flux 51 radiated from the output edge 23 of an SLD 50 of the embodiment. Since the operation speed of SLD is faster than that of LED, high speed transmission is possible.

The present invention has been described in connection with the preferred embodiments. The invention is not limited only to the above embodiments. It is apparent that various modifications, improvements, combinations, and the like can be made by those skilled in the art.

What we claim are:

1. An edge emission type semiconductor device, comprising:
    a substrate having a first output edge and a second reflection edge disposed in parallel with each other and a principal surface connecting the first output edge with the second reflection edge;
    an active layer formed on the principal surface and made of a semiconductor material that radiates light upon injection of carriers;
    a ridge-like region disposed on said active layer along a path interconnecting a point on the first output edge and a point on the second reflection edge, said ridge-like region being made of a semiconductor material having a refraction index smaller than a refraction index of said active layer, said ridge-like is region defining a waveguide, the path being disposed along the principal surface and including a first region on the side of the first output edge and a second region on the side of the second reflection edge, at an intersecting point of the first region and the first output edge, a first angle being taken between a normal to the first output edge directing toward the principal surface and the first region, and at an interconnecting point of the second region and the second reflection edge, a second angle smaller than the first angle being taken between a normal to the second reflection edge directing toward the principal surface and the second region; and
    electrodes for injecting current in a region of said active layer along the path.

2. An edge emission type semiconductor device according to claim 1, wherein the first region is straight and the second region has a curved pattern without a point of inflection.

3. An edge emission type semiconductor device according to claim 1, wherein the first region is straight and the second region includes a straight region connected to the second reflection edge and a curved region smoothly connecting the straight region to the first region.

4. An edge emission type semiconductor device according to claim 1, wherein the second angle is from 0° to 3°.

5. An edge emission type semiconductor device according to claim 1, wherein the first angle is from 2° to 10°.

6. An edge emission type semiconductor device according to claim 1, wherein the principal surface of said substrate is rectangular or square and the semiconductor device further comprises a protective film covering third and fourth side surfaces other than the first output edge and the second reflection edge among the four side surfaces of said substrate, from a position deeper than a lower surface of said active layer to corresponding side surfaces of a top layer on said substrate.

7. An edge emission type semiconductor device according to claim 6, wherein regions corresponding to an edge between the third side surface and the principal surface and an edge between the fourth side surface and the principal surface are chamfered, opposite ends of said active layer are positioned in areas of slanted surfaces of the chamfered regions, and the protective film covers the slanted surfaces of the chamfered regions and does not cover a region of the third and fourth side surfaces deeper than the slanted surfaces of the chamfered regions.

8. An edge emission type semiconductor device according to claim 1, further comprising an antireflection film formed on the first output edge.

9. The edge emission type semiconductor device according to claim 1, wherein a reflection film is formed on the second reflection edge.

10. The edge emission type semiconductor device according to claim 1, wherein an antireflection film is formed on the first output edge.

11. A spatial optical communication device comprising:
    an edge emission type semiconductor device comprising a substrate having first and second edges disposed in parallel with each other and a principal surface connecting the first edge with the second edge, an active layer formed on the principal surface and made of a semiconductor material that radiates light upon injection of carriers, a ridge-like region disposed on said active layer along a path interconnecting a point on the first edge and a point on the second edge, said ridge-like region being made of a semiconductor material having a refraction index smaller than a refraction index of said active layer, said ridge-like region defining a waveguide, the path being disposed along the principal surface and including a first region on the side of the first edge and a second region on the side of the second edge, at an intersecting point of the first region and the first edge, a first angle being taken between a normal to the first edge directing toward the principal surface and the first region, and at an intersecting point of the second region and the second edge, a second angle smaller than the first angle being taken between a normal to the second edge directing toward the principal surface and the second region, and electrodes for injecting current in a region of said active layer along the path; and a light receiving device for receiving light radiated from the first edge of said edge emission type semiconductor device.

* * * * *